United States Patent [19]

Strouss

[11] Patent Number: 5,541,942
[45] Date of Patent: Jul. 30, 1996

[54] METHOD AND SYSTEM FOR TESTING MEMORY UTILIZING SPECIFIC BIT PATTERNS

[75] Inventor: Chuck Strouss, Redmond, Wash.

[73] Assignee: Microsoft Corporation, Redmond, Wash.

[21] Appl. No.: 259,544

[22] Filed: Jun. 14, 1994

[51] Int. Cl.⁶ .......................... G11C 29/00; G01R 31/28
[52] U.S. Cl. ............................................ 371/21.3; 371/27
[58] Field of Search ........................... 371/21.3, 27, 51.1

[56] References Cited

U.S. PATENT DOCUMENTS 4,195,770  4/1980  Benton et al. ..................... 371/51.1
4,528,634  7/1985  Nakahata et al. .................... 364/491

Primary Examiner—Hoa T. Nguyen
Attorney, Agent, or Firm—Seed and Berry

[57] ABSTRACT

An improved method for testing computer memory is provided. In a preferred embodiment of the present invention, copies of a bit pattern are written throughout memory until the memory is filled. The contents of the memory are read and compared to the bit patted to determine memory errors. In a preferred embodiment, the bit pattern consists of a sequence of groups of bytes. The groups of bytes have a variable number of bytes. Each group in the sequence alternates between all 1s and all 0s with the last group of the sequence containing a combination of 1s and 0s.

2 Claims, 3 Drawing Sheets

5,541,942

METHOD AND SYSTEM FOR TESTING MEMORY UTILIZING SPECIFIC BIT PATTERNS

TECHNICAL FIELD

The present invention relates generally to data processing systems and, more particularly, to testing memory within a data processing system.

BACKGROUND OF THE INVENTION

There are many methods currently available for testing the memory in data processing systems like a computer system. Although the methods vary, the method depicted in FIG. 1 is typical. FIG. 1 is a flow chart of the steps performed as part of a prior method for testing memory. In step 102, the prior method writes a specific bit pattern to an area of memory that is to be tested. In step 104, the prior method reads the area of memory where the bit pattern was written. In step 106, the prior method compares the written bit pattern and the read bit pattern. In step 108, the prior method determines whether the written bit pattern and the read bit pattern are the same or equal. In step 110, if the bit patterns are not equal, the prior method indicates to the user that there is a memory error. If, however, the bit patterns are equal, processing continues. In step 112, the prior method determines whether there is more memory for testing. If the prior method determines that there is more memory for testing, the prior method continues to step 102 wherein the specific bit pattern is written to the next contiguous portion of memory. Processing continues until the entire area of memory has been tested by the repetitive writing of one bit pattern of data, reading back the bit pattern, and comparing the written bit pattern to the read bit pattern.

Various different bit patterns have been used to test memory. For example, bit patterns of all 1s and all 0s have been used. Different bit patterns can detect different types of memory errors. That is, the testing of memory with one bit pattern may not detect a certain error, whereas testing with a different pattern may detect that error. It is desirable to test memory using a bit pattern that tends to maximize the errors detected.

SUMMARY OF THE INVENTION

A preferred embodiment of the present invention provides a method for testing memory of a computer system. The method of the preferred embodiment writes copies of a bit pattern into memory until the entire memory is filled. This method reads the contents of the memory and compares the contents with the bit pattern to detect memory errors that may be undetected by prior methods. In a preferred embodiment, the bit pattern consists of a sequence of groups of bytes. The groups of bytes have a variable number of bytes. Each group in the sequence alternates between all 1s and all 0s with the last group in the sequence containing a combination of 1s and 0s.

DETAILED DESCRIPTION OF THE INVENTION

The present invention provides an improvement over the prior art for testing the memory of a data processing system. The preferred embodiment provides greater accuracy and efficiency in detecting memory errors by writing copies of a bit pattern sequentially until the memory is filled, reading the contents of the memory, and comparing the contents of the memory with the bit pattern to detect memory errors.

Figure 1:
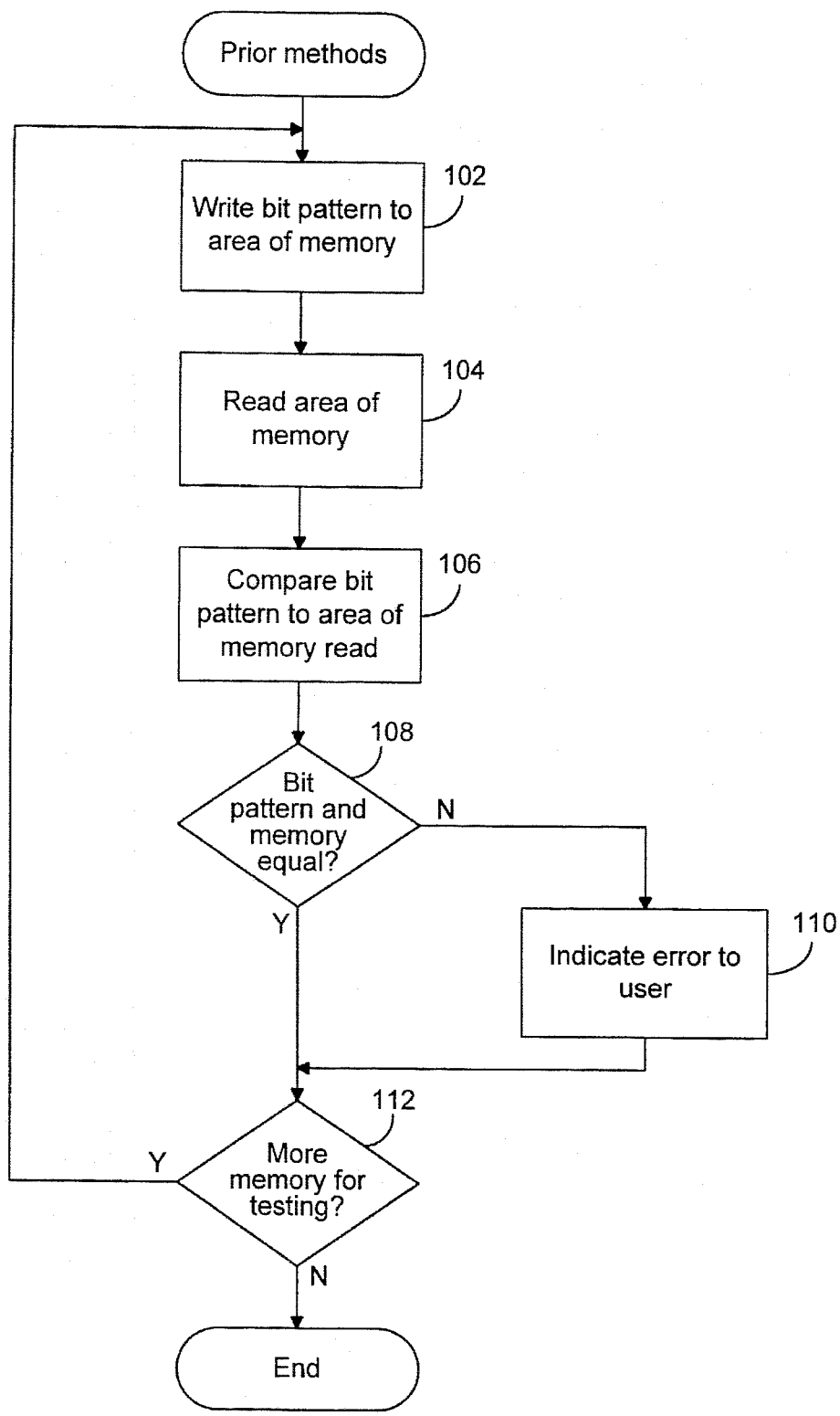
FIG. 1 is a flow chart of the steps performed in a prior art method for testing memory.
Figure 2:
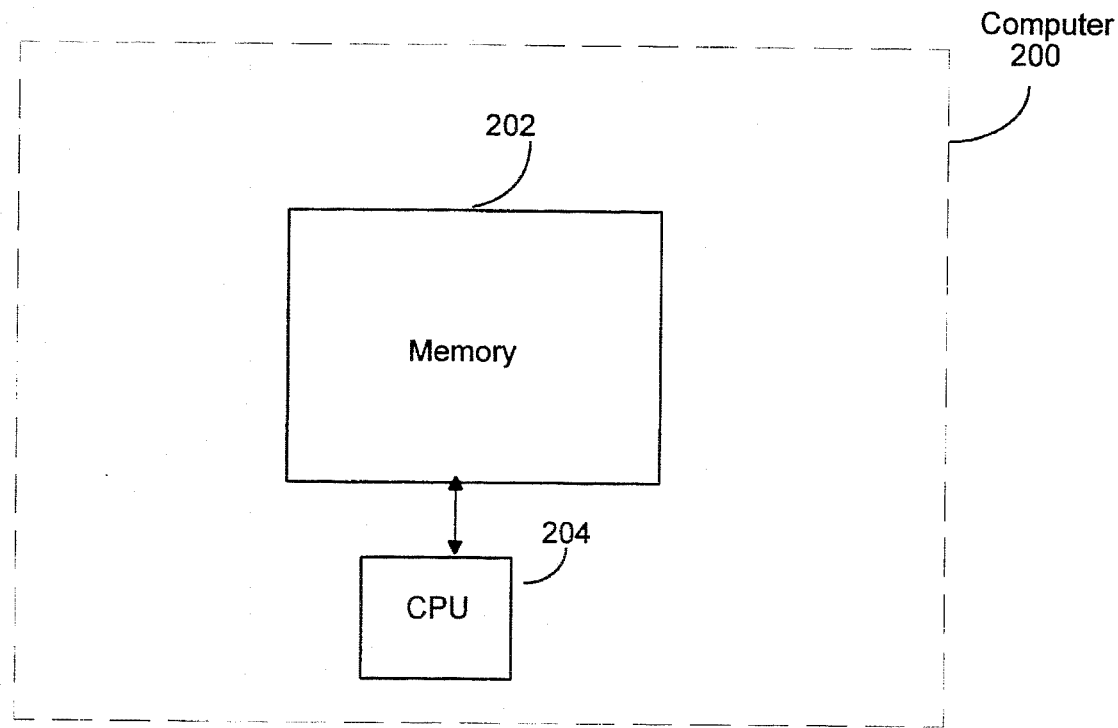
FIG. 2 is a block diagram of a computer system suitable for practicing a preferred embodiment of the present invention.

FIG. 2 is a block diagram of a computer system 200 suitable for practicing the present invention. The computer system 200 includes a central processing unit (CPU) 204 and a memory 202. The CPU 204 tests the memory 202 of computer 200. Although the present invention is described as being implemented to test memory on a computer system, those skilled in the art will recognize that the present invention can be used to test memory of other data processing systems including, but not limited to, communications devices, facsimile machines, video devices, and digital equipment.

Figure 3:
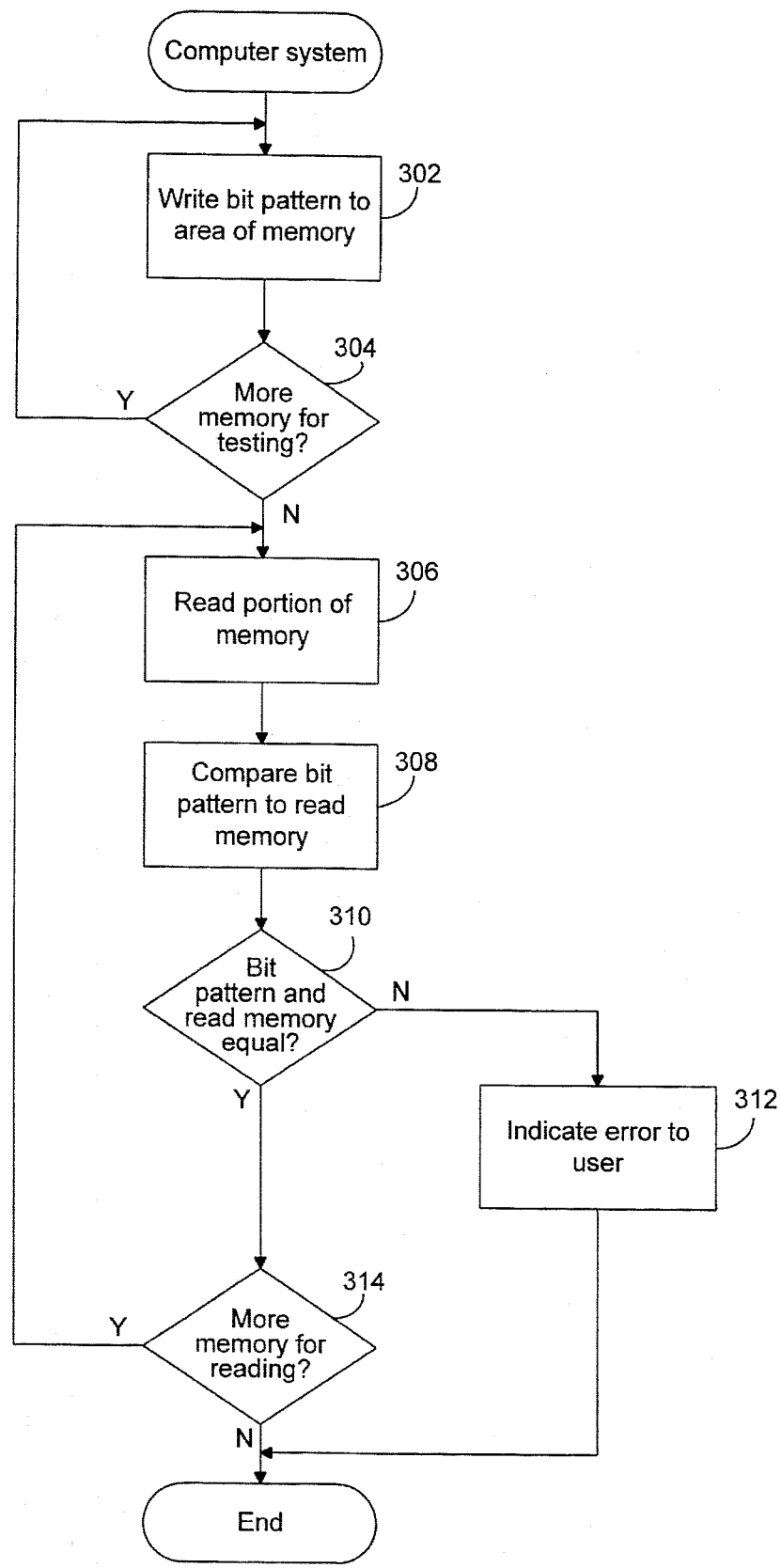
FIG. 3 is a flow chart of the steps performed in a preferred embodiment of the present invention.

FIG. 3 is a flow chart of the steps performed by a preferred computer system 200. The computer system tests memory by writing copies of a bit pattern into the memory until the memory is filled, reading the copied bit patterns from the memory, and comparing the written bit pattern with the read bit patterns. Although the computer system is described as testing the entire memory, the preferred embodiment can be used to test portions of memory. In step 302, the computer system 200 writes a bit pattern to the computer memory. The bit pattern that is used in a preferred embodiment is the following:

5 bytes of FF (11111111),
5 bytes of 0 (00000000),
3 bytes of FF (11111111),
1 byte of 0 (00000000),
1 byte of FF (11111111),
3 bytes of 0 (00000000),
1 byte of FF (11111111),
2 bytes of 0 (00000000),
4 bytes of FF (11111111),
3 bytes of 0 (00000000),
1 byte of AA (10101010).

As is well known in the art, a byte contains eight bits and a nibble contains four bits. A byte, therefore, contains two nibbles and the most significant bit of each nibble is referred to as "the high order bit." Thus, the above bit pattern depicts a sequence of groups of bytes with each group of bytes in the sequence toggling the high order bit of the nibbles in the bytes. That is, in one group, the high order bit of the nibbles is set to "1" and in the next group, the high order bit of the nibbles is set to "0". In step 304, if the memory is larger than the bit pattern, the computer system continues to step 302 wherein another copy of the bit pattern is written to the location of memory contiguous to where the previous copy of the bit pattern was written. Once the memory is completely filled with copies of the bit pattern, the computer system continues to step 306. In step 306, the computer system reads a portion of the memory to obtain a read bit pattern. In step 308, the computer system compares the written bit pattern to the read bit pattern. In step 310, the computer system determines whether the written bit pattern and the read bit pattern are the same or equal. If the bit patterns are not equal, then the computer system indicates to the user that the memory has an error and processing ends in step 312, where the location and nature of the error are provided to the user. If the bit patterns are equal, then processing continues to step 314. In step 314, the testing system determines whether the entire area of memory has been read. If more memory needs to be read, processing continues to step 306 and another portion of the memory is read. However, if the entire memory has been read, processing ends.

In an alternative embodiment of the present invention, when an error is detected, processing does not terminate. Rather, in the alternative embodiment, processing continues to detect more errors. Thus, when processing has completed, all memory errors are detected.

While the present invention has been described with reference to a preferred embodiment thereof, those skilled in the art will know of various changes in form that may be made without departing from the spirit and scope of the claimed invention as defined in the appended claims.

What is claimed is:

1. A method for testing an area of memory in a data processing system, the data processing system having a memory, comprising the steps of:

writing a bit pattern into the area of memory, the bit pattern consisting essentially of five bytes set to FF, five bytes set to 0, three bytes set to FF, one byte set to 0, one byte set to FF, three bytes set to 0, one byte set to FF, 2 bytes set to 0, four bytes set to FF, three bytes set to 0, and one byte set to AA;

reading contents of the area of memory; and comparing the contents of the area of memory to the bit pattern to detect memory errors.

2. A data processing system comprising:

a memory for testing, the memory having a plurality of areas;

a writing component for writing a bit pattern into an area of the memory, the bit pattern consisting essentially of five bytes set to FF, five bytes set to 0, three bytes set to FF, one byte set to 0, one byte set to FF, three bytes set to 0, one byte set to FF, two bytes set to 0, four bytes set to FF, three bytes set to 0, and one byte set to AA;

a reading component for reading contents of the area of the memory; and a compare component for comparing the read contents to the bit pattern to detect memory errors.

* * * * *